(12) United States Patent
Joo

(10) Patent No.: US 10,990,135 B2
(45) Date of Patent: Apr. 27, 2021

(54) ELECTRONIC DEVICE WITH COMPONENT-PROTECTING STRUCTURE

(71) Applicant: LSIS CO., LTD., Anyang-si (KR)

(72) Inventor: Sang-Oh Joo, Anyang-si (KR)

(73) Assignee: LSIS CO., LTD., Gyeonggi-Do (KR)

( * ) Notice: Subject to any disclaimer, the term of this patent is extended or adjusted under 35 U.S.C. 154(b) by 48 days.

(21) Appl. No.: 16/277,499

(22) Filed: Feb. 15, 2019

(65) Prior Publication Data

US 2019/0258299 A1    Aug. 22, 2019

(51) Int. Cl.
*G06F 1/16*        (2006.01)
*H05K 5/02*        (2006.01)
*H05K 5/03*        (2006.01)

(52) U.S. Cl.
CPC .......... *G06F 1/1656* (2013.01); *G06F 1/1613* (2013.01); *G06F 1/1633* (2013.01); *G06F 1/1681* (2013.01); *H05K 5/0226* (2013.01); *H05K 5/03* (2013.01); *G06F 2200/1631* (2013.01); *G06F 2200/1633* (2013.01)

(58) Field of Classification Search
CPC ... G06F 1/1656; G06F 1/1607; H05K 5/0256; H05K 5/0278; H05K 5/026; H01R 2201/18; H01R 2201/04; H01R 2201/06; H01R 13/44
See application file for complete search history.

(56) References Cited

U.S. PATENT DOCUMENTS

| | | | | |
|---|---|---|---|---|
| 4,675,782 A * | 6/1987 | Hibbert | ..................... | H02B 1/40 361/600 |
| 5,351,176 A * | 9/1994 | Smith | ..................... | G06F 1/181 248/917 |
| 7,075,781 B2 * | 7/2006 | Peng | ..................... | G06F 1/1616 361/679.55 |
| 7,789,437 B2 * | 9/2010 | Sheng | ..................... | G06F 1/1658 292/137 |
| 9,529,392 B2 * | 12/2016 | Lee | ..................... | G06F 1/1656 |
| 2009/0219676 A1 * | 9/2009 | Murakata | ..................... | H05K 5/06 361/679.01 |
| 2010/0085691 A1 * | 4/2010 | Yeh | ..................... | H04B 1/3888 361/679.01 |

(Continued)

FOREIGN PATENT DOCUMENTS

CN    202333009 U    7/2012
CN    202351760 U    7/2012

(Continued)

OTHER PUBLICATIONS

European Search Report for related European Application No. 19157557.0; action dated Jun. 17, 2019; (8 pages).

(Continued)

*Primary Examiner* — Jinhee J Lee
*Assistant Examiner* — Douglas R Burtner
(74) *Attorney, Agent, or Firm* — K&L Gates LLP

(57) ABSTRACT

The present invention relates to an electronic device having a component-protecting structure that may waterproof and dustproof components exposed to the outside of the electronic device. According to the present disclosure, since the protection cover is pivotably supported by the hinge structure, the protection cover may be prevented from being broken even when the user continuously opens and closes the protection cover.

10 Claims, 6 Drawing Sheets

(56) References Cited

U.S. PATENT DOCUMENTS

2013/0044420 A1\* 2/2013 Iwamoto ................. G06F 1/182
361/679.01
2016/0143164 A1 5/2016 Wang et al.
2019/0361492 A1\* 11/2019 Urimoto ............. E05B 65/0067

FOREIGN PATENT DOCUMENTS

| JP | S62191176 A | 8/1987 |
| JP | H0512569 U | 2/1993 |
| JP | 2001295829 A | 10/2001 |
| JP | 2002353647 A | 12/2002 |
| JP | 2005003125 A | 1/2005 |
| JP | 2005129770 A | 5/2005 |
| JP | 2008010599 A | 1/2008 |
| JP | 2008235671 A | 10/2008 |
| JP | 2014179529 A | 9/2014 |
| JP | 2014204109 A | 10/2014 |
| JP | 2017069605 A | 4/2017 |

OTHER PUBLICATIONS

Korean Office Action for related Korean Application No. 10-2018-0019481; action dated Apr. 29, 2019; (4 pages).
Japanese Office Action for related Japanese Application No. 2019-017105; action dated Mar. 6, 2020; (4 pages).

\* cited by examiner

[FIG. 1]
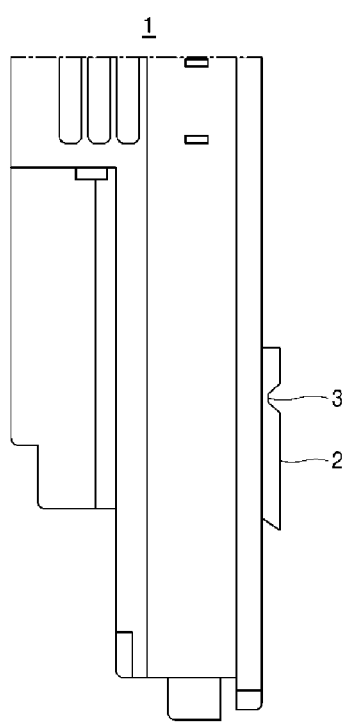

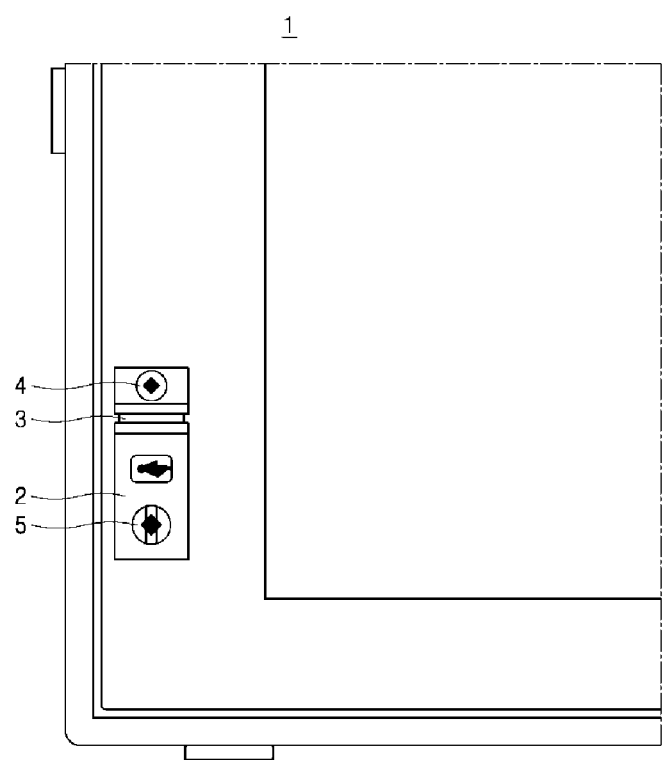
[FIG. 2]

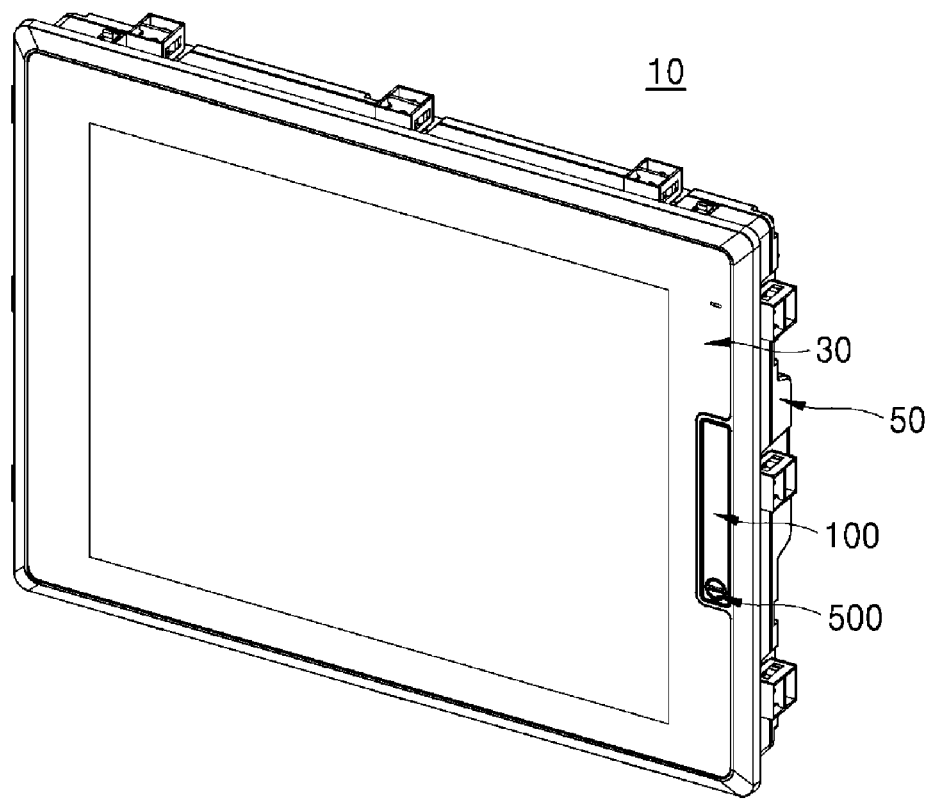
[FIG. 3]

[FIG. 4]
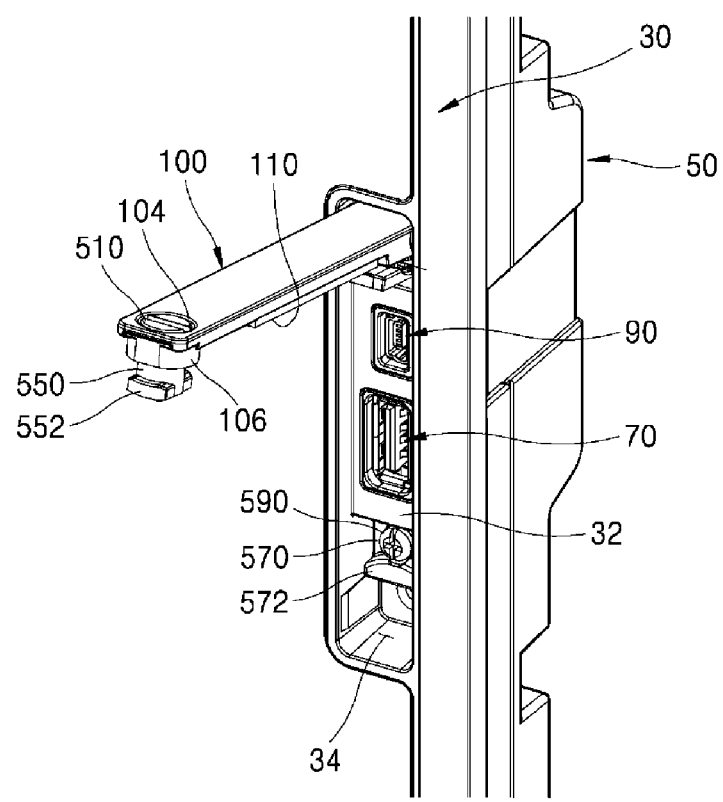

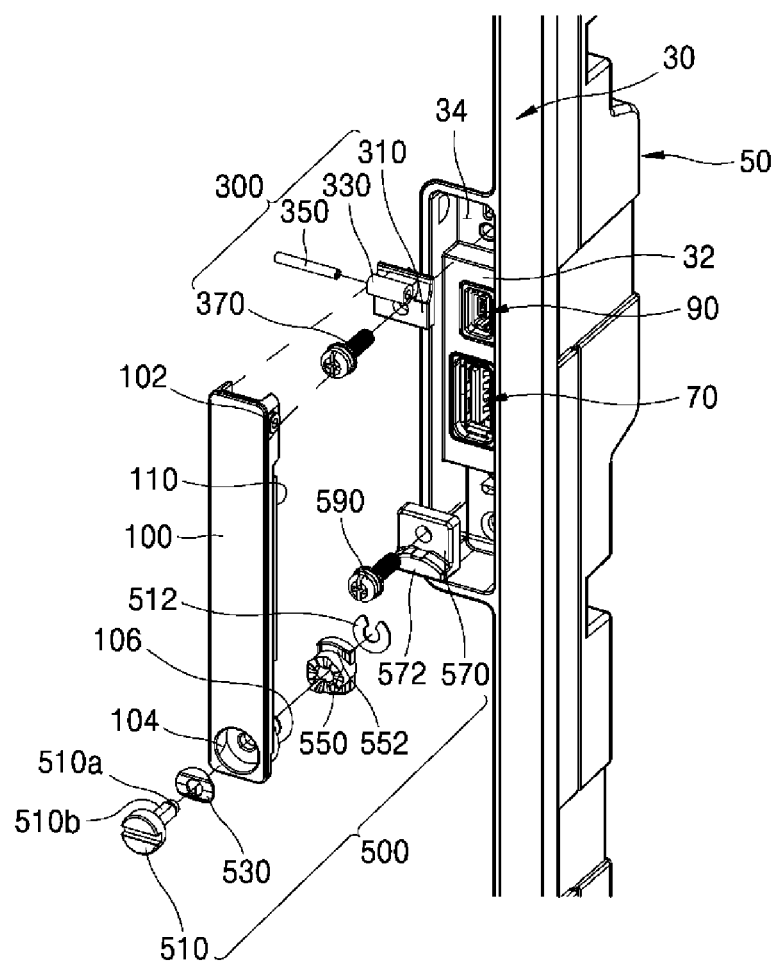
[FIG. 5]

[FIG. 6]
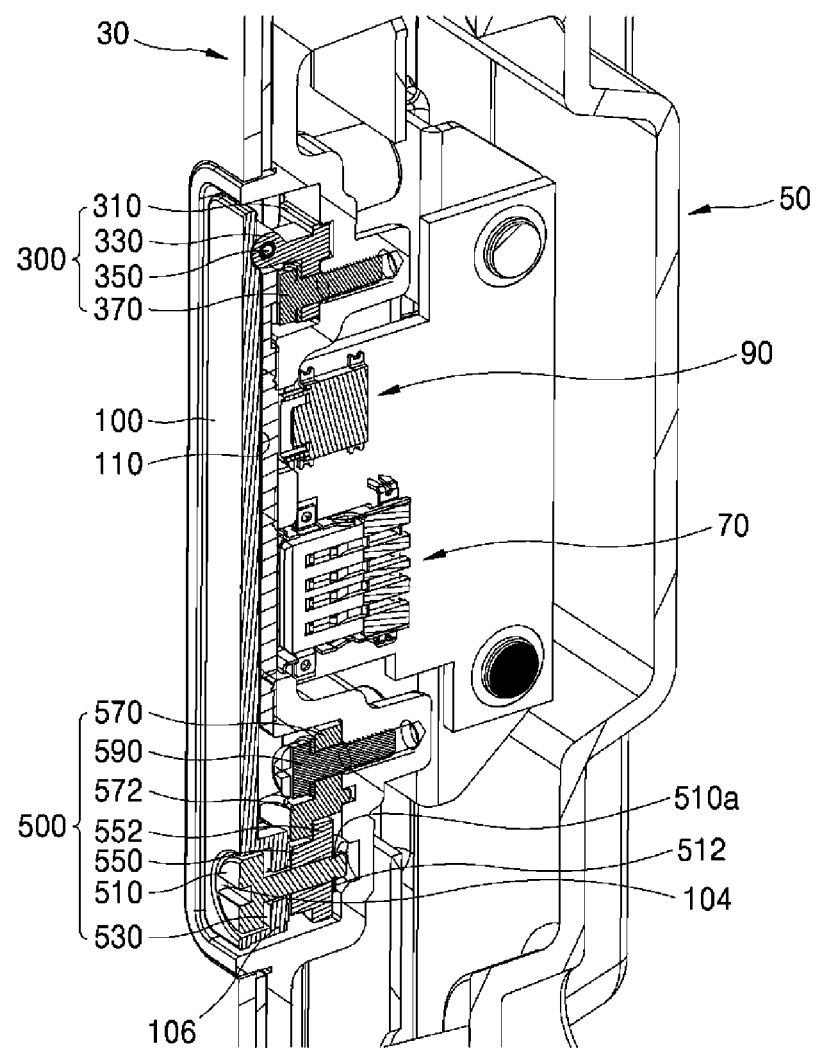

ELECTRONIC DEVICE WITH COMPONENT-PROTECTING STRUCTURE

CROSS-REFERENCE TO RELATED APPLICATION

Pursuant to 35 U.S.C. § 119(a), this application claims the benefit of earlier filing date and right of priority to Korean Application No. 10-2018-0019481, filed on Feb. 19, 2018, in the Korean Intellectual Property Office, the disclosure of which is incorporated herein in its entirety by reference.

TECHNICAL FIELD

The present disclosure relates to an electronic device having a component-protecting structure that may waterproof and dustproof components exposed to the outside of the electronic device.

BACKGROUND

In general, a HMI (Human Machine Interface) device or panel PC means a multifunctional control device (electronic device) in a form of a panel excluding integrated mechanical elements such as a hard disk, a CD driver, a cooling fan, etc. such that the device may be easily used by a field worker.

The HMI device is provided in various forms including a fixed panel form in which the device may be fixed to a panel and a removable panel form in which the operator removes the device from the panel.

The above-mentioned electronic device includes a component such as a USB terminal or a mini USB terminal for connecting a USB. The component is installed in such a way that a portion of the component is exposed outside the device due to an attribute of the component.

The component partially exposed to the outside of the electronic device is susceptible to moisture and dust. Thus, a protection cover is often used to protect the exposed component.

FIG. 1 is a partial side view of a conventional component-protecting cover structure of a electronic device. FIG. 2 is a partial front view of the component-protecting cover structure according to FIG. 1.

As shown in FIG. 1 and FIG. 2, the protection cover 2, which protects exposed components such as a terminal of the electronic device 1, is fixed at one end via a fixed screw 4. The protection cover 2 has a groove 3 adjacent to the one end fixed by the fixed screw 4. The groove is defined so as to facilitate folding when opening and closing the cover. The protection cover 2 is opened and closed around the groove 3. A closed state in which the protection cover 2 covers the component in the electronic device 1 is kept by a locking screw 5.

However, since the conventional protection cover 2 is made of plastic material, stress is generated in the groove 3 portion when the cover is repeatedly opened and closed. When the stress limit for the groove 3 is exceeded, the corresponding groove portion is cut off and the protection cover 2 cannot function properly.

Further, when the user repeatedly tightens or loosens the locking screw 5 to use the component, there occurs a problem that a thread or the screw head is worn and lost its function.

SUMMARY

In order to solve the problem, a purpose of the present disclosure is to provide a component protection assembly that is resistant to a stress resulting from opening/closing and is less susceptible to breakage.

Further, another purpose of the present disclosure is to provide a component protection assembly that minimizes risk of the damage due to the repetitive locking and unlocking.

The purpose of the present disclosure is not limited to the above-mentioned purposes. Other purposes and advantages of the present disclosure that are not mentioned may be understood by following descriptions, and will be more clearly understood by embodiments of the present disclosure. It is to be further understood that the purposes and advantages of the present disclosure may be realized and attained by means of means and combinations thereof recited in the appended claims.

In one aspect of the present disclosure, there is provided an electronic device having a component-protecting structure, the device comprising: a front cover and a rear cover mutually coupled to form an appearance of the device; a component-mounted portion formed in a partial region of the receiving space, wherein the receiving space is defined in a side face portion of the front cover or the rear cover; a plurality of components and mounted onto the component-mounted portion so as to be exposed partially; and a component protection assembly, wherein the component protection assembly includes: a protection cover having a shape corresponding to a shape of the receiving space and being constructed for opening/closing the receiving space; a hinge installed in one end of the receiving space to pivotably support one end of the protection cover; and a cover holder installed in the other end of the receiving space and being constructed for locking or unlocking the protection cover via a clockwise or counterclockwise rotation of the cover holder.

In one implementation, the protection cover is coplanar with a surface of the front cover or the rear cover in a closed state of the receiving space.

In one implementation, an exposed surface of the component-mounted portion is not coplanar with an open top face of the receiving space.

The device of one of claims to, wherein the component protection assembly includes a gasket coupled to a back face of the protection cover to seal between the component-mounted portion and the protection cover.

In one implementation, the hinge includes: a hinge bracket disposed in one end of the receiving space and coupled to the front or rear cover having the space via a hinge screw; a shaft support integrally formed with the hinge bracket, wherein the shaft is hollowed in a longitudinal manner; and a hinge shaft pivotally inserted into the hollow of the shaft support.

In one implementation, both ends of the hinge shaft protrude out of the shaft support, wherein the protection cover has a shaft inserted portion defined in one end thereof and in each side face thereof, wherein each of the protruding ends of the hinge shaft is inserted at each shaft inserted portion.

In one implementation, the cover holder includes: a holder pin passing through the other end of the protection cover and rotating clockwise or counterclockwise; an elastic member coupled between the protection cover and the holder pin to elastically support the holder pin in an insertion direction thereof; a holder body coupled to the holder pin and rotatable via rotation of the holder pin; and a holder bracket received in the other end of the receiving space and coupled to the front or rear cover having the space via a holder screw, wherein the holder bracket has a stopper groove to latch or unlatch the holder body.

In one implementation, the holder pin has a cylindrical body and has a pivot preventive portion b formed longitudinally along and on an outer face of the cylindrical body.

In one implementation, the holder body has a cylindrical body having a hollow portion defined therein into which the holder pin is inserted, wherein the cylindrical body of the holder body has one end having a concave-convex structure.

In one implementation, the protection cover has, at the other end thereof, a cylindrical portion protruding toward the holder body, wherein a distal end of the cylindrical portion has a concavo-convex structure corresponding to the concavo-convex structure of the holder body.

In one implementation, the holder body has a pair of holder ribs protruding from an outer circumferential surface of the cylindrical body, wherein the ribs are arranged in a straight line.

In one implementation, the holder pin has a pin shoulder a at one end passing through the holder body, wherein a diameter of the pin abruptly changes at the pin shoulder, wherein the component protection assembly further includes pin fixing means having a U-shape, wherein the means is coupled to the pin shoulder a while the holder pin is inserted through the holder body.

In one implementation, each of the holder ribs is gradually convexly protruding in a direction from both ends thereof toward a center thereof, wherein the stopper groove has a shape corresponding to a shape of each of the holder ribs.

According to the present disclosure, since the protection cover is pivotably supported by the hinge structure, the protection cover may be prevented from being broken even when the user continuously opens and closes the protection cover.

Further, according to the present disclosure, the cover holder may be rotated to switch between locking and unlocking states. There is no need to apply a strong force to tighten a screw to close the protection cover. This may prevent the protection cover from being damaged.

The above features improve the durability of the component protection assembly. The waterproof and dustproof efficiency of the component to be protected is improved.

Further, the durability of the component protection assembly can be improved to reduce the component price and assembly cost.

Further specific effects of the present disclosure as well as the effects as described above will be described in conduction with illustrations of specific details for carrying out the invention.

BRIEF DESCRIPTION OF THE DRAWINGS

FIG. 1 is a partial side view of a conventional component-protecting cover structure for an electronic device.

FIG. 2 is a partial front view of the component-protecting cover structure according to FIG. 1.

FIG. 3 is a perspective view of an electronic device having a component-protecting structure according to one embodiment of the present disclosure.

FIG. 4 is a perspective view showing a state in which a protection cover of the component protection assembly according to FIG. 3 is opened.

FIG. 5 is an exploded perspective view of the component protection assembly according to FIG. 3.

FIG. 6 is a cross-sectional view showing a coupling state of the component protection assembly according to FIG. 3.

DETAILED DESCRIPTION

Hereinafter, a coupling mechanism for coupling an electronic device in accordance with the present disclosure will be described with reference to the accompanying drawings.

For simplicity and clarity of illustration, elements in the figures. are not necessarily drawn to scale. The same reference numbers in different figures. denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Unless defined otherwise, all terms used herein have the same meaning as commonly understood by one of ordinary skill in the art. When the terms used herein are in conflict with a general meaning of the term, the meaning of the term is in accordance with a definition used herein.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

FIG. 3 is a perspective view of an electronic device having a component-protecting structure according to one embodiment of the present disclosure. FIG. 4 is a perspective view showing a state in which a protection cover of the component protection assembly according to FIG. 3 is opened. FIG. 5 is an exploded perspective view of the component protection assembly according to FIG. 3. FIG. 6 is a cross-sectional view showing a coupling state of the component protection assembly according to FIG. 3. For convenience, a direction toward a front cover is defined as a forward direction while a direction toward a rear cover is defined as a rearward direction.

As shown in FIG. 3, the electronic device 10 in accordance with the present disclosure may include an HMI (Human Machine Interface) device or a panel PC, which may be coupled to an outer casing or used in an independent manner. The electronic device 10 includes a front cover 30 and a rear cover 50 which form the appearance.

As shown in FIGS. 4 to 6, one side face portion of the front cover 30 has a receiving space 34 defined therein extending toward the rear cover 50. The receiving space 34 is opened at the front cover 30 to form an opened portion. The receiving space 34 may be recessed, for example, in a rectangular parallelepiped shape. Further, the receiving space 34 may be formed on one side face portion of the rear cover 50 rather than one side face portion of the front cover 30. The receiving space 34 may be partially defined by a component-mounted portion 32 onto which a plurality of components 70 and 90 are mounted.

The component-mounted portion 32 may occupy a partial region of the receiving space 34. Exposed faces of the components 70 and 90 may be located at an inner position than an top of the receiving space 34. That is, the component-mounted portion 32 has a top at a higher level from a bottom level of the receiving space 34. Thus, the component-mounted portion 32 may have a rectangular parallelepiped shape smaller than the receiving space 34.

The components 70 and 90 such as a terminal for coupling such as USB or mini-USB may be mounted onto the component-mounted portion 32. Portions of the components 70 and 90 are exposed through the surface of the component-mounted portion 32. The component-mounted portion 32 and the receiving space 34 are covered and opened by a component protection assembly.

The component protection assembly may include a protection cover 100 covering the receiving space 34, a hinge 300 pivotably supporting the protection cover 100, and a cover holder 500 for keeping the protection cover 100 in an open or closed state.

The protection cover 100 is a rectangular plate having a length and a width corresponding to a length a width of the receiving space 34. Further, the protection cover 100 has a thickness corresponding to a spacing between a top level of the component-mounted portion 32 and the top level of the receiving space 34. The protection cover 100 has one end pivotably supported by the hinge 300. The other end thereof is opened and closed by a cover holder 500. In FIG. 4, the protection cover 100 is pivotally supported by the hinge 300 at its upper end of the cover. A cover holder 500 is provided at a lower end of the cover 100.

The protection cover 100 has a shaft inserted portion 102 defined in a side face of one longitudinal end of the cover 100. A hinge shaft 350 to be described later is inserted into the shaft inserted portion 102. The protection cover 100 has, at the other end thereof, an accommodation hole 104 in which a holder pin 510 and an elastic member 530 of the cover holder 500 are inserted. A holder mounted portion 106 is provided on an inner face opposite to the accommodation hole 104. A holder body 550 of the cover holder 500 is coupled to the holder mounted portion 106.

The pin-mounted portion 102 is formed on the side face of one end of the protection cover 100. The pin-mounted portion 102 has a hole into which each of both ends of the hinge shaft 350 is inserted. The pin inserted portion 102 has a circular hole corresponding to the shape of a cross section of the hinge shaft 350. The hole of the pin insertion portion 102 may be formed in a predetermined spaced-apart manner from the end of the protection cover 100. This is to ensure a gap allowing an end of the protection cover 100 to pivot within the receiving space when pivoting the protection cover 100.

The accommodation hole 104 is formed to open toward the front cover 30 of the electronic device 10. The accommodation hole 104 is formed to have a size such that a head of the holder pin 510 can be inserted into the hole 104. The head of the holder pin 510 is inserted into the accommodation hole 104. A portion of the pin 510 except for the head passes through the accommodation hole 104 and protrudes from a back face of the protection cover 100.

The holder-mounted portion 106 is formed in a position opposite to the accommodation hole 104 and is formed to protrude in a cylindrical shape. The cylindrical end of the holder-mounted portion 106 is in close contact with a holder body 550, which will be described later, via the holder pin 510.

In one example, a gasket 110 has a rectangular shape corresponding to the shape of the protection cover 100. The gasket 110 is longitudinally coupled to the inner face of the protection cover 100. In this connection, the inner face of the protection cover 100 means the face facing the component-mounted portion 32. The gasket 110 may have at least a size corresponding to the size of the component-mounted portion 32. Since the protection cover 100 has a thickness equal to the spacing between a top level of the component-mounted portion 32 and the top level of the receiving space 34, the gasket 110 is pressurized by the protection cover 100 and pressed against the component-mounted portion 32 in a compressed state when the protection cover 100 is closed.

The components 70 and 90 need to be dustproofed and waterproofed. Thus, the gasket 110 should be sized to sufficiently cover the component-mounted portion 32. The gasket 110 may have a size that is greater than or equal to the size of the component-mounted portion 32. In this case, the gasket has a size such that the gasket does not interfere with the operation of the hinge 300 and the cover holder 500.

The hinge 300 supports one end of the protection cover 100 pivotably. The hinge 300 includes a hinge bracket 310 disposed in the receiving space 34 and coupled to the front cover, a shaft support 330 formed on the hinge bracket 310 for pivotably supporting the hinge shaft 350, the hinge shaft 350 inserted into the shaft support 330, and a hinge screw 370 for fixing the hinge bracket 310.

The hinge bracket 310 has a size corresponding to the spacing from one longitudinal end of the receiving space 34 to the component-mounted portion 32. The hinge bracket 310 is in the form of a plate having a predetermined thickness. The hinge bracket 310 is fixed to a portion of the front cover defining a top portion (in FIG. 4) of the receiving space 34 by the hinge screw 370. The shaft support 330 may be integrally formed with the hinge bracket 310.

The shaft support 330 has a cylindrical shape. A elongate hole corresponding to an elongate shape of the hinge shaft 350 is formed in the support 330. The hinge shaft 350 is inserted into the shaft support 330. The protection cover 100 is coupled to the hinge shaft 350.

The hinge shaft 350 has a cylindrical shape. While the hinge shaft 350 is inserted into the shaft support 330, both ends of the shaft 350 protrude out of the shaft inserted portion 102 and are coupled to the protection cover 100. Each of the protruding ends of the hinge shaft 350 is inserted into the shaft insertion portion 102 of the protection cover 100. The hinge shaft 350 may be press-fit into the shaft inserted portion 102 such that the coupling state thereof with the protection cover 100 is maintained. The hinge shaft 350 may be rotated while being inserted into the shaft support 330. Thus, the hinge shaft 350 and the shaft inserted portion 102 are fixed to each other. Thus, when the protection cover 100 is pivoted, the hinge shaft 350 rotates about the shaft support 330.

The hinge screw 370 is a threaded screw which couples the hinge bracket 310 in the receiving space 34 to the front cover. The operator may tighten the hinge screw 370 to secure the hinge bracket 310 in the receiving space 34 to the front cover or unscrew the hinge screw 370 to allow the hinge bracket 310 to be removed.

Since the protection cover is pivotably supported by the hinge structure, it is possible to prevent the protection cover from being damaged even when the protection cover is continuously opened and closed.

In this way, one end of the protection cover 100 is pivotably supported by the hinge 300, while the other end of the cover 100 is open or closed by the cover holder 500.

The cover holder 500 includes a holder pin 510 accommodated in the accommodation hole 104 of the protection cover 100, an elastic member 530 elastically supporting the holder pin 510, a holder body 550 having an opening/closing function, a holder bracket 570 for latching or unlatching the holder body 550, and a holder screw 590 for fixing the holder bracket 570.

The holder pin 510 has a cylindrical body and a head having a larger diameter than the body. While the holder pin 510 is inserted into the accommodation hole 104 of the protection cover 100, the head portion thereof is exposed toward the front face. In the head of the holder pin 510, a groove is formed in which a user can insert a tool. The user may rotate the holder pin to allow the holder body 550 to be in the locking or unlocking position.

A end of the body of the holder pin 510 has a pin shoulder 510a having a reduced diameter portion. Pin fixing means 512 is coupled to the pin shoulder 510a to fix the holder pin 510 and the holder body 550 to each other. The pin fixing means 512 may be composed of a U-shaped metal material or the like.

Further, the cylindrical outer circumferential surface of the holder pin 510 may be partially changed into a flat face in a longitudinal direction. This may be formed via G cut machining. Hereinafter, this flat face may be defined as a pivot prevention structure 510b. The hollow shape of the holder body 550, which will be described later, also has a shape that is partially flattened to correspond to the flat shape of the pivot prevention structure 510b of the holder pin 510. Therefore, when the holder pin 510 is inserted into the holder body 550, the holder pin 510 may be kept in a coupled state without rotating freely.

The holder pin 510 passes through the elastic member 530 into the accommodation hole 104 of the protection cover 100 and then passes through the holder-mounted portion 106 such that the pin shoulder 510a is exposed. The end of the holder pin 510, which is exposed out of the holder-mounted portion 106, is inserted into the holder body 550, and, then, passes through the holder body 550 and is exposed out of the holder body 550 in a rearward direction. The pin fixing means 512 is coupled to the pin shoulder 510a of the holder pin 510 as exposed out of the holder body 550. The holder pin 510 must rotate the holder body 550. Thus, the holder pin 510 must not be removed from the holder body 550. Thus, the pin fixing means 512 may be used for this purpose. The pin fixing means 512 prevents the holder pin 510 from being removed in the front direction of the protection cover 100.

The elastic member 530 is inserted into the accommodation hole 104 of the protection cover 100. The member 530 may be embodied as a ring shaped plate spring in which a hollow portion is defined so that the holder pin 510 can penetrate the hollow portion. The elastic member 530 is convexly curved toward the head of the holder pin 510. The elastic member 530 applies a predetermined pressure to the holder pin 510 and the holder body 550 when the protection cover 100 is opened or closed, thereby to prevent the holder pin 510 and the holder body 550 to move.

The holder body 550 has a cylindrical shape, and has a hollow portion into which the holder pin 510 is inserted. The hollow portion is formed in the inserting direction of the holder pin 510. The holder body 550 has a concavo-convex structure at an end facing the holder-mounted portion 106. The concavo-convex structure has the convexly protruding portions and the concaved portions which are alternately formed. Although not shown in the drawing, the holder-mounted portion 106 also has an end having a concave-convex structure corresponding to the concave-convex structure of the holder body 550. Thus, the protection cover 100 is in a locked state when the convex portion of the holder body 550 and the concave portion of the holder mounted portion 106 are in close contact with each other. Conversely, when the convex portion of the holder body 550 and the convex portion of the holder-mounted portion 106 are in contact with each other, the protection cover 100 is in an unlocked state.

A distance between the holder body 550 and the protection cover 100 when the convex portion of the holder body 550 and the convex portion of the holder-mounted portion 106 are in contact with each other than is larger than a distance between the holder body 550 and the protection cover 100 when the convex portion of the holder body 550 and the concave portion of the holder-mounted portion 106 are in contact with each other. Therefore, a gap occurs between the locking and unlocking states of the protection cover 100. However, since the holder pin 510 is being pressed by the elastic member 530, the gap may be compensated for by the elastic member 530. Therefore, the holder pin 510 does not move while being coupled to the holder body 550.

Further, the holder body 550 has the concavo-convex structure. Thus, during rotation of the holder body 550, the convex portion of the holder body 550 moves over and along the convex and concave structure of the holder-mounted portion 106. Especially, the convex portion of the holder body 550 moves from the concave portion of the holder-mounted portion 106 to the convex portion of the portion 106, a sound or vibration occurs. Accordingly, the user may sense the rotation direction and rotation degree of the holder body 550.

The holder body 550 includes, on the outer circumferential surface thereof, a pair of holder ribs 552 protruding to have a predetermined width.

The holder ribs 552 are formed on the outer circumferential surface of the holder body 550, and the pair of the holder ribs 552 are arranged in a straight line. The holder rib 552 protrudes in the radial direction of the holder body 550, and thus is perpendicular to the hollow portion direction of the holder body 550.

The holder ribs 552 are inserted into or released from a stopper groove 572 as described later according to the rotation of the holder body 550. The holder ribs 552 are arranged in a line with the stopper groove 572 and the latching state is maintained. This refers to the locking state of the protection cover 100. Conversely, the holder ribs 552 are arranged perpendicular to the stopper groove 572, and the unlatching state is maintained. This may refer to the open state of the protection cover 100.

The holder rib 552 must be selectively coupled to the stopper groove 572 via rotation. Thus, the end of the rib is formed into a streamlined shape. In the streamlined shape of the holder rib 552, the rib 552 is gradually convexly protruding as it goes toward a center thereof. The holder rib 552 must rotate clockwise or counterclockwise to be engaged or be disengaged with the stopper groove 572. Therefore, it is preferable that the holder rib 552 has the streamlined shape in which the rib 552 is gradually convexly protruding as it goes toward a center thereof.

The holder body 550 is coupled to the holder-mounted portion 106 such that the concavo-convex structure of the holder body 550 contacts the concavo-convex structure of the holder-mounted portion 106 of the protection cover 100. The present disclosure may not be limited thereto. The holder-mounted portion 106 may be eliminated and the holder body 550 may be coupled directly to the rear face of the protection cover 100. The holder body 550 is engaged or disengaged with the stopper groove 572 formed in the holder bracket 570.

The holder bracket 570 has a size corresponding to a spacing from the longitudinal other end of the receiving space 34 to the component-mounted portion 32. The holder bracket 570 is in the form of a plate having a predetermined thickness. The holder bracket 570 is inserted between the component-mounted portion 32 and the lower end of the receiving space 34. The holder bracket 570 is disposed in the receiving space 34 and coupled to the front cover by a holder screw 590.

The stopper groove 572 is defined in the holder bracket 570. One end of the front face of the holder bracket 570 protrudes forwardly to have a predetermined thickness. In the holder bracket 570, the stopper groove 572 is formed concavely at a lower end of the protruding portion. The stopper groove 572 is formed in a streamlined shape corresponding to the shape of the holder rib 552.

The holder screw 590 is a threaded screw that couples the holder bracket 570 in receiving space 34 to the front cover. The user may tighten the holder screw 590 to secure the holder bracket 570 in the receiving space 34 to the front cover. The holder bracket 570 may also be removed by the user unscrewing the holder screw 590.

In this way, the cover holder may rotate to be switched between the locking and unlocking states. Thus, it is not necessary to apply a strong force to tighten the screw to close the protection cover. This may prevent the protection cover from being broken.

In the above-described embodiment, the protection cover has the shaft inserted portion and the hinge has the shaft support. Conversely, the protection cover may have the shaft support and the hinge may have the shaft inserted portion.

Further, although an upper end of the protection cover is described as being pivotably supported via the hinge, a lower end of the cover may be pivotably supported via the hinge.

A process of opening and closing the protection cover using the component protection assembly according to an embodiment of the present disclosure having the above-described configuration will be described as follows. FIG. 4 shows the open state of the protection cover, and FIG. 6 shows the closed and locked state of the protection cover.

In the closed and locked state of the protection cover 100, the user may open the protection cover 100 by rotating the holder pin 510 either clockwise or counterclockwise. The closed state of the protection cover 100 is configured such that the protection cover 100 closes the receiving space 34. In the locked state, the holder rib 552 is latched by the stopper groove 572.

The holder pin 510 is fixed to the holder body 550. The holder body 550 has the holder ribs 552 inserted into the stopper groove 572 of the holder bracket 570. Since the holder ribs 552 are arranged in a straight line, the holder ribs 552 are caught by or separated from the stopper groove 572 when the holder body 550 rotates in either clockwise or counterclockwise direction.

When the user rotates the holder body 550 by pivoting the holder pin 510 in the locked state of the protection cover 100, the holder ribs 552 inserted into the stopper groove 572 are released from the stopper groove 572. When the holder ribs 552 are released from the stopper groove 572, the force to keep the protection cover 100 to be closed is removed. Therefore, the protection cover 100 becomes openable. The user may press the hinge 300 of the protection cover 100 to pivot the protection cover 100 to open the receiving space.

Although not shown in the drawing, for easy opening of the protection cover, an elastic member may be further provided to push the protection cover when the holder ribs are unlatched.

Conversely, when switching the protection cover 100 to the closed and locked state, the user may press the hinge 300 of the protection cover 100. The user may press the protection cover 100 to close the receiving space 34 and then rotate the holder pin 510 clockwise or counterclockwise.

When the protection cover 100 rotates the holder pin 510 in the closed position, the holder body 550 fixed to the holder pin 510 rotate together. As the holder body 550 rotates, the holder ribs 552 rotate and enters the stopper groove 572 of the holder bracket 570. When the rotation of the holder pin 510 further progresses, the holder ribs 552 are completely inserted into the stopper groove 572 and latched by the groove.

When the protective cover 100 is switched to the closed position while the holder ribs 552 are arranged in the straight line with the stopper groove 572, the protection cover 100 cannot completely close the receiving space due to the protruding portion of the holder rib 552.

Therefore, it is preferable that the user rotates the holder body 550 such that the holder ribs 552 are arranged perpendicular to the stopper groove 572 before the protection cover 100 is switched to the closed position. In this state, the holder pin 510 may be rotated to latch the holder ribs 552 by the stopper groove 572 to keep the protection cover 100 in the locked state.

In the above embodiment, components of the protection cover, the hinge, and the cover holder may be made of an electrically non-conductive metal material or the like to improve the durability. Alternatively, the components of the protection cover, the hinge, and the cover holder may be made of an electrically insulating coating on an electrically conductive metal material. Some components of the protection cover, hinge, and cover holder may be made of synthetic materials such as plastics as needed.

It will be apparent to those skilled in the art that various modifications and variations may be made in the present invention without departing from the spirit of the present disclosure. The technical scope of the present disclosure is not limited to the contents described in the embodiments but should be determined by the claims and equivalents thereof

What is claimed is:

1. An electronic device having a component-protecting structure, the device comprising:
    a front cover and a rear cover mutually coupled to form an appearance of the device;
    a component-mounted portion formed in a partial region of a receiving space, wherein the receiving space is defined in a side face portion of the front cover or the rear cover;
    a plurality of components mounted onto the component-mounted portion so as to be exposed partially; and
    a component protection assembly,
    wherein the component protection assembly includes:
        a protection cover having a shape corresponding to a shape of the receiving space and being constructed for opening/closing the receiving space;
        a hinge installed in one end of the receiving space to pivotably support one end of the protection cover; and
        a cover holder installed in the other end of the receiving space and being constructed for locking or unlocking the protection cover via a clockwise or counterclockwise rotation of the cover holder,
    wherein the cover holder includes:
        a holder pin passing through the other end of the protection cover and rotating clockwise or counterclockwise;
        an elastic member coupled between the protection cover and the holder pin to elastically support the holder pin in an insertion direction thereof;
        a holder body coupled to the holder pin and rotatable via rotation of the holder pin; and
        a holder bracket coupled to the receiving space via a holder screw, wherein the holder bracket has a stopper groove to latch or unlatch the holder body,
    wherein the holder body has a cylindrical body having a hollow portion defined therein into which the holder pin is inserted,
    wherein the cylindrical body of the holder body has one end having a concave-convex structure,
    wherein the protection cover has, at the other end thereof, a cylindrical portion protruding toward the holder body, and
    wherein a distal end of the cylindrical portion has a concavo-convex structure corresponding to the concavo-convex structure of the holder body.

2. The device of claim 1, wherein the protection cover is coplanar with a surface of the front cover or the rear cover in a closed state of the receiving space.

3. The device of claim 1, wherein a top surface of the component-mounted portion is not coplanar with a bottom surface of the receiving space.

4. The device of claim 1, wherein the component protection assembly includes a gasket coupled to a back face of the protection cover to seal between the component-mounted portion and the protection cover.

5. The device of claim 1, wherein the hinge includes:
    a hinge bracket coupled to the receiving space via a hinge screw;
    a shaft support integrally formed with the hinge bracket, wherein the shaft support is hollowed in a longitudinal manner; and
    a hinge shaft pivotally inserted into the hollow of the shaft support.

6. The device of claim 5, wherein both ends of the hinge shaft protrude out of the shaft support,
    wherein the protection cover has a shaft inserted portion defined in one end thereof and in each side face thereof,
    wherein each of the protruding ends of the hinge shaft is inserted at each shaft inserted portion.

7. The device of claim 1, wherein the holder pin has a cylindrical body and has a pivot preventive portion formed longitudinally along and on an outer face of the cylindrical body.

8. The device of claim 1, wherein the holder body has a pair of holder ribs protruding from an outer circumferential surface of the cylindrical body, wherein the ribs are arranged in a straight line.

9. The device of claim 1, wherein the holder pin has a pin shoulder at one end passing through the holder body, wherein a diameter of the pin abruptly changes at the pin shoulder,
    wherein the component protection assembly further includes pin fixing means having a U-shape, wherein the means is coupled to the pin shoulder while the holder pin is inserted through the holder body.

10. The device of claim 8, wherein each of the holder ribs is gradually convexly protruding in a direction from both ends thereof toward a center thereof, wherein the stopper groove has a shape corresponding to a shape of each of the holder ribs.

* * * * *